United States Patent

Mowbray et al.

Patent Number: 6,119,263
Date of Patent: Sep. 12, 2000

[54] SYSTEM AND METHOD FOR TRANSMITTING DATA

[75] Inventors: Miranda Jane Felicity Mowbray, Bristol, United Kingdom; James Andrew Davis, Richmond, Va.; Kenneth Graham Paterson, Bristol; Simon Edwin Crouch, Chippenham, both of United Kingdom

[73] Assignee: Hewlett-Packard Company, Palo Alto, Calif.

[21] Appl. No.: 09/067,459

[22] Filed: Apr. 28, 1998

[30] Foreign Application Priority Data

Apr. 30, 1997 [EP] European Pat. Off. ............. 97302946

[51] Int. Cl.$^7$ .................................................. H03M 13/00
[52] U.S. Cl. .................... 714/781; 714/776; 714/757; 714/758; 375/260; 375/295
[58] Field of Search .................... 714/781, 782, 714/758, 776, 757

[56] References Cited

U.S. PATENT DOCUMENTS

| | | | |
|---|---|---|---|
| 4,937,828 | 6/1990 | Shih et al. | 714/752 |
| 5,103,451 | 4/1992 | Fossey | 714/754 |
| 5,282,214 | 1/1994 | Dravida | 714/752 |
| 5,410,309 | 4/1995 | Jedwab et al. | 375/260 |
| 5,425,020 | 6/1995 | Gregg et al. | 370/17 |
| 5,583,872 | 12/1996 | Albrecht et al. | 370/476 |
| 5,694,407 | 12/1997 | Glaise | 714/807 |
| 5,754,564 | 5/1998 | Francis | 714/752 |

FOREIGN PATENT DOCUMENTS 0 612 175  8/1994  European Pat. Off. .

OTHER PUBLICATIONS

Davis J.A. Et Al.: "Finding Cyclic Redundancy Check Polynomials for Multilevel Systems" HP Laboratories Technical Report, vol 97–05, Jan. 1997.

Piret P. Et Al.: "MDS Convolutional Codes" IEEE Transactions on Information Theory, vol. IT–29, No. 2, Mar. 1983, USA.

Primary Examiner—Albert De Cady
Assistant Examiner—Esaw Abraham

[57] ABSTRACT

A data packet is transmitted by dividing it into sub-packets, for example by distributing successive bytes of the data packet to different sub-packets each containing at most $p^n-1$ symbols, where p is a prime number, and transmitting the sub-packets along two or more respective paths. CRC checksums are added to the sub-packets, the checksum for each path being generated using a different and respective generator polynomial of degree b. These generator polynomials are selected so that, for arithmetic carried out modulo p, each polynomial has a respective factor of degree at least b−n+1, and the collection of polynomials which are each exactly divisible by all such factors constitutes a BCH code. As a result the system has advantageous properties in respect of error detection and implementation.

20 Claims, 1 Drawing Sheet

SYSTEM AND METHOD FOR TRANSMITTING DATA

TECHNICAL FIELD

This invention relates to systems and methods for transmitting data over a plurality of channels, such as a cable having a plurality of conductors (for example, two twisted pairs of wires), and for detecting the occurrence of errors in the course of such data transmission.

BACKGROUND ART

The spread of personal computers and workstations has led to the development of networks for interconnecting such equipment and common resources such as printers and data storage devices. More powerful and sophisticated computing equipment and programs have progressively become available, allowing the processing of data in larger and larger quantities, for example in the form of database information and graphic images. These developments have in turn placed increasing demands on the speed and capacity of networks.

Various new networking technologies have been proposed to cater for these demands. One recent proposal has been established as IEEE Standard 802.12, and is also known as 100VG-AnyLAN. This technology, which transfers data at 100 megabits/s (Mb/s), involves splitting a data frame to be transmitted into consecutive blocks of five bits each, encoding the blocks using a 5B6B code, distributing the encoded blocks among four twisted-pair conductors, and applying a cyclic redundancy check (CRC) code to each of the encoders's output bit streams, using the same CRC generator polynomial for each of the bit streams.

Although networks based on this technology are being deployed and meet current requirements, it is envisaged that future computing developments will eventually require even higher-speed and thus higher-capacity networks. Such higher-speed networks will also require that several channels be used in parallel. Moreover, the high speed will bring with it further needs for efficient error detection.

There are two kinds of errors which may corrupt data during transmission. The first kind is random errors due to, for example, thermal noise. These may corrupt any bit on any channel and anywhere in the packet with (in general) equal probability, but are usually rare enough that there is a negligible probability of there being a large number of symbols corrupted in this way in the same packet. The second kind is errors due, for example, to temporary interference by nearby electrical equipment. These errors are correlated in time; if a symbol on one channel is corrupted by such an error, a symbol sent on a parallel channel at the same time is more likely to be corrupted by a 'correlated' error than a symbol sent at a different time. A particular kind of correlated error is the 'burst' error, which is a correlated error limited in duration.

Standard design of CRC codes involves choosing a generator polynomial which:

has large order, so as to detect error patterns which are restricted in duration;
has large Hamming distance, so as to detect error patterns caused by thermal noise; and
is divisible by the polynomial $(x-1)$, which acts as a parity check in the case where the signals are binary, and which has similar useful properties in the case of non-binary signals provided that the generator polynomial is also carefully chosen.

The longer the CRC code or checksum, the larger the burst it is guaranteed to detect, but the longer the time spent calculating, transmitting, and checking the checksum.

Systems currently in use either use a CRC on the entire data stream, or (as in the case of 100VG-AnyLAN) apply a checksum to each channel, using the same generator polynomial for all channels. Applying m checksums each of length b symbols to m channels sending data in parallel provides similar (though in general not identical) capabilities for detecting thermal noise errors to applying a single checksum of length m.b to the data. The advantages of using m checksums in parallel are:

it may be possible to implement CRCs of length b using standard circuit designs when this is not possible for CRCs of the longer length m.b, so the cost of implementation may be smaller;
the m checksums can be transmitted and processed in parallel and hence the time overhead for error detection may be reduced; and
in general it is easier to find CRCs with good detection properties of shorter lengths.

A disadvantage is that in general the burst error detection capabilities of m checksums of length b in parallel are not as good as the burst error detection capabilities of a single checksum of length m.b.

Furthermore, there has hitherto been no known way of constructing CRC polynomials with desirable properties of detecting more general correlated errors.

It is an object of this invention to provide a system and method for communicating data over multiple channels, which has improved capabilities in detecting correlated errors without requiring a large time overhead or specialized hardware for computing checksums of long length. It is a further object of the invention to provide a method of constructing CRC polynomials which assists in enabling these capabilities to be obtained.

DISCLOSURE OF INVENTION

According to one aspect of this invention there is provided a system for transmitting packets of data along a plurality of paths, said data being transmitted along each path in sub-packets containing at most $p^n-1$ symbols, where p is a prime number, n is a positive integer and the number of different possible symbols is an integer power of p, wherein data transfer on each path is checked for occurrence of errors using cyclic redundancy checks, the cyclic redundancy check for each path being implemented using a respective and different cyclic redundancy check polynomial of degree b greater than n, and these different cyclic redundancy check polynomials are chosen to have the property that, when all arithmetic is carried out modulo p, each said polynomial has a respective factor of degree at least $b-n+1$ such that the collection of polynomials (over GF(p)) which are each exactly divisible by all such factors constitutes a BCH code.

BRIEF DESCRIPTION OF DRAWINGS

A system and method for transmitting data in accordance with this invention will now be described, by way of example, with reference to the accompanying drawing, in which.

BEST MODE FOR CARRYING OUT THE INVENTION, & INDUSTRIAL APPLICABILITY

Figure 1:
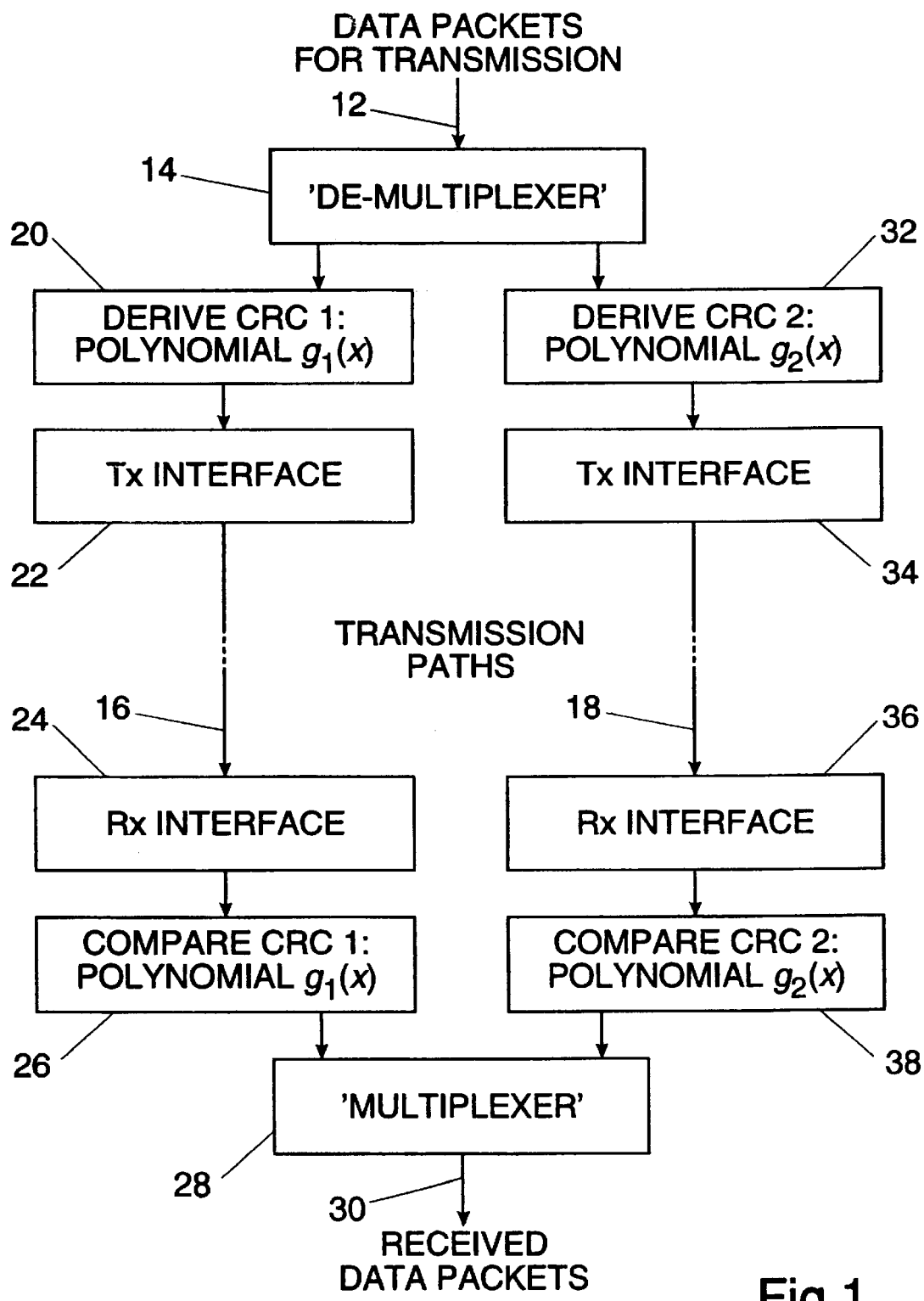
FIG. 1 shows a system for transmitting data along two paths, using CRC codes for error detection.

FIG. 1 shows an example of a system for transmitting data with CRC codes for error detection, using the present invention. In this example it is assumed, for convenience of illustration, that each data packet contains up to 72,000 binary symbols (9,000 8-symbol bytes), and that these data packets are to be divided for transmission as two sub-packets over two respective data paths simultaneously, each sub-packet containing up to 36,000 symbols (4,500 bytes).

Referring to FIG. 1, data packets to be transmitted are received on an input line 12 and supplied to a 'de-multiplexer' 14 which distributes successive portions (e.g. 8-symbol bytes) of a packet for transmission along each of two paths 16 and 18 alternately. The circuit 14 is described herein as a de-multiplexer even though its input signal is not a multiplex signal in the conventional sense, since its function is essentially that of demultiplexing: cyclically routing successive portions of the incoming signal to respective ones of its outputs according to a predetermined pattern.

Symbols directed along the path 16 are fed to a first CRC generator 20, which derives (in this example) a thirty-three bit CRC checksum from the sub-packet of up to 4,500 bytes supplied by the de-multiplexer to the generator 20 for one input data packet, and appends this checksum to that sub-packet. The checksum is derived in known manner (e.g. using a shift register) in accordance with a predetermined CRC algorithm, in this case using the following binary polynomial of degree thirty-three:

$$g_1(x)=x^{33}+x^{32}+x^{25}+x^{24}+x^{23}+x^{22}+x^{21}+x^{17}+x^{14}+x^{13}+x^9+x^8+x^7+x^6+x^3+1$$

After any other desired processing and conditioning of the sub-packet data for transmission (which, being incidental to the present invention, are not shown here), signals representing those data are transferred via a physical link transmission interface 22 over the path 16, which may be for example an electrical twisted-pair cable or a fibre-optic cable.

The transferred signals are coupled by a physical link receive interface 24, after appropriate conditioning and processing of the signals (again not shown), to a CRC comparator 26. This comparator calculates a CRC checksum from the sub-packet of data as received, using the polynomial $g_1(x)$, and compares the checksum thus calculated with the checksum appended to the sub-packet. Any discrepancy between the calculated and received checksums indicates that the data have been corrupted in some way during transmission, in which case data correction algorithms may be applied and/or retransmission of the data sub-packet may be requested. Otherwise the verified data are supplied to a 'multiplexer' 28 which operates in a complementary manner to the demultiplexer 14 to interleave data received over the two paths 16 and 18 into a complete packet for output via a line 30.

Symbols directed along the path 18 are processed in a similar manner by a second CRC generator 32, a physical link transmit interface 34, a physical link receive interface 36 and a CRC comparator 38. These modules function in the same manner as their counterparts for the path 16, except that the CRC generator 32 and the CRC comparator 38 do not use the polynomial $g_1(x)$. Instead they use a second binary polynomial also of degree thirty-three:

$$g_2(x)=x^{33}+x^{30}+x^{27}+x^{26}+x^{25}+x^{24}+x^{20}+x^{19}+x^{16}+x^{12}+x^{11}+x^{10}+x^9+x^8+x+1$$

The data transmission system shown in FIG. 1 has the following error detection properties:

it detects any error pattern which is identical on the two paths and involves nine or fewer errors on each path;

it detects any error pattern involving five or fewer errors within either the sub-packet transmitted on the path 16 or the sub-packet transmitted on the path 18 (irrespective of whether there is any error of any kind in the sub-packet on the other path); and it detects any error pattern which affects at most 32 consecutive symbols on either of the two paths 16 and 18 (again irrespective of whether there is any error of any kind in the sub-packet on the other path).

As noted above, transferring the data over two (or more) paths in parallel and applying a separate CRC to each has the advantage that the respective checksums can be transmitted and processed in parallel, so the time overhead for error detection may be reduced. Moreover with this invention the correlated error detection capabilities of the parallel checksums are generally better than those of parallel checksums all involving the same CRC polynomial, or involving arbitrarily selected different polynomials.

It is also possible to implement the invention with CRC polynomials which can be represented by an integer multiple of eight symbols (i.e. a typical byte). Thus, for example, for sub-packets each up to 127 symbols long, the CRC generator 20 and the CRC comparator 26 may use the degree sixteen polynomial $$g_3(x)=x^{16}+x^{10}+x^8+x^6+x^3+1$$

and the CRC generator 32 and comparator 38 the polynomial $$g_4(x)=x^{16}+x^{13}+x^9+x^8+x^6+1$$

A system using CRC checksums based on this pair of polynomials has the same error detection properties as for the polynomials $g_1(x)$ and $g_2(x)$, for sub-packets up to 127 symbols long, except that detection of an error pattern affecting a block of consecutive symbols on either of the two paths 16 and 18 is limited to blocks of at most 16 symbols rather than 32.

The general procedure for identifying a pair of generator polynomials for use in the CRC generators and comparators 20, 26, 32, 38, such as $g_1(x)$ and $g_2(x)$, or $g_3(x)$ and $g_4(x)$, will now be described. For this purpose certain notation will be used, as follows:

it is assumed that each packet on the input line 12 consists of symbols drawn from a set comprising a number $p^y$ of different possible symbols, where p is a prime number and y is an integer; thus for binary systems p=2 and y=1, for quaternary systems p=2 and y=2, and for nonary systems p=3 and y=2;

the number of paths over which data are transferred is m; in the present description m=2, but as explained below the invention is applicable with three or more paths;

the number of symbols in a sub-packet transferred over one path is at most $p^n-1$, where n is an integer; thus the number of symbols in a packet on the input line 12 is at most $m.(p^n-1)$;

the degree of the required generator polynomials, and thus the number of symbols in each CRC checksum, is represented by b.

It is required that $p \leq 2b < p^n-1$, and either b>2n or p=2 and b>n. The value b is decomposed into the expression $b_0.n+b_1$, where $b_0$ and $b_1$ are integers and $1 \leq b_1 \leq n$.

Step 1: Find a 'primitive polynomial' of degree n over the Galois Field with p elements GF(p), that is with coefficients each in the range 0 to (p−1) and with all arithmetic being carried out modulo p. A primitive polynomial of degree n is one which does not divide the expression ($x^w-1$) modulo p, for any value of $w<p^n$; finding such a polynomial can be accomplished, for example, by reference to Finite Fields, by R. Lidl & H. Niederreiter, Cambridge University Press, 1984, which contains tables of these polynomials (Chapter 10) and methods for constructing them (Chapter 3).

Step 2: Determine a polynomial $h_1(x)$ such that $$h_1(x) = \Pi_{1 \leq l \leq b_0}(\text{minimal polynomial of } \alpha^{k(j)})$$

where $\Pi$ indicates a product, $\alpha$ is a root of the primitive polynomial found in step 1 and k(j) is defined below. A minimal polynomial of the root $\alpha$ is the polynomial of smallest degree having a coefficient of unity for its highest-order term and having a as a root; it is noted that as the polynomial found at step 1 is primitive and hence is irreducible, it is itself a minimal polynomial of all of its roots; it is also noted that the polynomial $h_1(x)$ has a degree of at most $b_0 \cdot n$, since the degree of the minimal polynomial of any power of $\alpha$ is at most n.

The sequence $(k(j):i \geq 1)$ is defined as follows:

$k(1)=1$;

for $j>1$, k(j) is the least integer which is not equal to $p^r k(l)$ modulo $(p^n-1)$, for any $1 \leq l < j$, and $0 \leq r < n$.

$\alpha^{k(j)}$ is then the least power of a which is not a root of the product of the minimal polynomials of $\alpha^{k(1)}, \alpha^{k(2)}, \ldots, \alpha^{k(j-1)}$ In the case of binary symbols, k(j) can be determined using strings of n symbols as follows:

the first string comprises n−1 binary 0 digits followed by a binary 1 digit; this defines k(1); for example, for n=5, k(1)=00001=1;

each subsequent binary value is derived by incrementing the previous value by one, and discarding values whose binary representation is cyclically equivalent to that of any earlier value; for n=5, the second possible value is 00010, which is cyclically equivalent to 00001 and is discarded; the next value 00011=3 is retained as k(2); the following value 00100 is discarded, but the value 00101=5 is retained as k(3).

Step 3: Determine another polynomial $h_2(x)$ as the reverse of $h_1(x)$, that is the polynomial such that the coefficient of $x^j$ in $h_2(x)$ is equal to the coefficient of $$x^{\text{degree of } h_1(x) - j}$$

in $h_1(x)$; in other words, the coefficients for the terms of $h_2(x)$ are the same as for those of $h_1(x)$, but taken in reverse order.

Step 4: Select two polynomials $f_1(x)$, $f_2(x)$ of degree (b−1-degree of $h_1(x)$); if there are two irreducible polynomials in GF(p)[x] of degree (b−1-degree of $h_1(x)$) which are not multiples of each other or of (x−1) or of x, then choose $f_1(x)$, $f_2(x)$ to be two such polynomials; otherwise make $f_1(x)=f_2(x)$=a polynomial of degree (b−1-degree of $h_1(x)$). These two polynomials are used, if necessary, to compensate for any mis-match between the degree of (x−1) $\cdot h_1(x)$ and (x−1) $\cdot h_2(x)$ and the required degree b. In the case where (b−1-degree of $h_1(x)$)=2, for example, irreducible polynomials can be selected by choosing a number B in GF(p) which is not a square modulo p; the polynomial $x^2-B$ is then an irreducible polynomial of degree 2.

Step 5: Finally, set $g_1(x)=(x-1) \cdot f_1(x) \cdot h_1(x)$ $g_2(x)=(x-1) \cdot f_2(x) \cdot h_2(x)$ In the case where y=1, as in the examples given above, $g_1(x)$ and $g_2(x)$ are themselves the required pair of CRC generator polynomials; if y is greater than one, the CRC generator polynomials have the same coefficients as $g_1(x)$ and $g_2(x)$, but arithmetic must be done modulo $p^y$ instead of modulo p.

It can be shown that the least common multiple of this pair of polynomials $g_1(x)$, $g_2(x)$ derived in this manner generates a sub-code of a BCH (Bose/Ray-Chaudhuri/Hocquenghem) code over GF(p) with designed distance $2k(b_0+1)$. The designed distance of a BCH code is the maximum number of consecutive powers of $\alpha$ which are roots of the generator polynomial of the code. In this instance the generator polynomial is equal to $(x-1) \cdot h_1(x) \cdot h_2(x)$. See *The Theory of Error-Correcting Codes*, F. J. MacWilliams & N. J. A. Sloane, North-Holland, 1977, chapter 7, for a discussion of BCH codes. It can be seen that the each of the pair of polynomials $g_1(x)$, $g_2(x)$ includes a respective factor (x−1). $h_1(x)$ and $(x-1) \cdot h_2(x)$ of degree at least b−n+1; the collection of polynomials over GF(p) which are each exactly divisible by both of these factors constitutes a BCH code. Inclusion of the factors $f_1(x)$ and $f_2(x)$ selects a particular sub-code within this BCH code.

In consequence of the property of the BCH bound (pp. 201–202 of MacWilliams & Sloane), the code generated in this way detects, in a packet of length $\geq (p^n-1)$ symbols, any error pattern consisting of $2k(b_0+1)-1$ or fewer errors. Thus if there is any error pattern on the pair of paths which gives errors in $2k(b_0+1)-1$ or fewer identical places on each of the two paths, then this error pattern will be detected by the system because either the checksum on the first path or the checksum on the second path will report an error.

Both the polynomials $g_1(x)$, $g_2(x)$ generate sub-codes of BCH codes over GF(p) with designed distance $k(b_0+1)+1$. Thus if there is any error pattern giving errors in $k(b_0+1)$ or fewer places on one path then (irrespective of whether there is any error of any kind in the sub-packet on the other path) it will be detected.

The two polynomials $g_1(x)$, $g_2(x)$ have degree b. If there is an error pattern which is confined to fewer than b consecutive symbols on one of the paths, it will therefore be detected (again irrespective of whether there is any error of any kind in the sub-packet on the other path).

The procedure described above will be illustrated by deriving the two polynomials $g_1(x)$, $g_2(x)$ already given above with reference to the system shown in FIG. 1. In that case the symbols are binary, so p=2 and y=1. The maximum sub-packet size is 36,000 symbols, so the minimum value of n which gives $(p^n-1) \geq 36,000$ is 16 ($2^{16}-1=65535$). b is set to 33 as a design choice balancing cost of implementation against extent of error detection capability.

Step 1: We have n=16; reference to the tables in Lidl & Niederreiter gives a primitive polynomial $$x^{16}+x^5+x^3+x^2+1$$

Step 2: We need the minimal polynomial of $\alpha^3$, where $\alpha$ is a root of this primitive polynomial. For convenience of subsequent description the notation $\beta$ is used to represent $\alpha^3$.

From the minimal polynomial for $\alpha$ (i.e. the primitive polynomial itself), $\alpha^{15} \cdot \alpha + a^3 \cdot \alpha^2 + a^3 + \alpha^2 + 1 = 0$ $\alpha^{15} \cdot \alpha + \alpha^3(\alpha^2+1) + \alpha^2 + 1 = 0$ $\eta^5 \cdot \alpha = (\beta+1)(\alpha^2+1)$  (Eqn.A)

We now manipulate Eqn.A to produce an expression in terms solely of $\beta$. Cubing both sides of Eqn.A gives $$\beta^{16} = (\beta + 1)^3 \cdot (1 + \alpha^2)^3$$
$$= (\beta + 1)^3 \cdot (1 + \beta^2 + \alpha^2(1 + \alpha^2))$$
$$= (\beta + 1)^3 \cdot (1 + \beta^2) + (\beta + 1)^2 \cdot \alpha^2 \cdot (\beta + 1)(1 + \alpha^2)$$
$$= (\beta + 1)^3 \cdot (1 + \beta^2) + (\beta + 1)^2 \cdot \alpha^2 \cdot \beta^5 \cdot \alpha \text{ using Eqn. A}$$
$$= (\beta + 1)^3 \cdot (1 + \beta^2) + (\beta + 1)^2 \cdot \beta^6$$
$$= 1 + \beta + \beta^4 + \beta^5 + \beta^6 + \beta^8$$

Re-arranging this expression and substituting x for $\beta$ gives the minimal polynomial of $\alpha^3$ $$x^{16}+x^8+x^6+x^5+x^4+x+1$$

Step 3: $h_1(x)$ will be the product (minimal polynomial of $\alpha$).(minimal polynomial of $\alpha^3$), and $h_2(x)$ will be its reverse, e.g.

$$h_1(x)=(x^{16}+x^5+x^3+x^2+1).(x^{16}+x^8+x^6+x^5+x^4+x+1)$$

Step 4: In this case the degree of both minimal polynomials is 16, so the degree of $h_1(x)$ and $h_2(x)$ is 32; accordingly the degree of the product of $h_1(x)$ or $h_2(x)$ and (x–1) is 33, as required. Therefore no compensation for any mis-match of degree is required, and $f_1(x)$ and $f_2(x)$ can be set to unity.

Step 5: Using the general construction, $g_1(x)=(x-1).\text{(minimal polynomial of }\alpha\text{).(minimal polynomial of }\alpha^3\text{)}$ $g_1(x)=(x-1).(x^{16}+x^5+x^3+x^2+1).(x^{16}+x^8+x^6+x^5+x^4+x+1)$ $g_1(x)=x^{33}+x^{32}+x^{25}+x^{24}+x^{23}+x^{23}+x^{22}+x^{21}+x^{17}+x^{14}+x^{13}+x^9+x^8+x^7+x^6+x^3+1$ as given earlier with reference to FIG. 1.
$g_2(x)$ is the reverse of $g_1(x)$, i.e.

$g_2(x)=x^{33}+x^{30}+x^{27}+x^{26}+x^{25}+x^{24}+x^{20}+x^{19}+x^{16}+x^{12}+x^{11}+x^{10}+x^9+x^8+x+1$

As another illustration, the two polynomials $g_3(x)$, $g_4(x)$ already given above will be derived. Again p=2 and y=1. The maximum sub-packet size is 127 symbols, so the minimum value of n which gives $(p^n-1)\geq 127$ is $7(2^7-1=127)$. b has been chosen to be 16.

Step 1: We have n=7; reference to the tables in Lidl & Niederreiter gives a primitive polynomial $$x^7+x+1$$

Step 2: We need the minimal polynomial of $\alpha^3$, where $\alpha$ is a root of this primitive polynomial. Again $\beta$ is used to represent $\alpha^3$. From the minimal polynomial for $\alpha$, $$1=\alpha^7+\alpha$$
$$1=(\alpha^7+\alpha)^3$$
$$1=\alpha^{21}+\alpha^{15}+\alpha^9+\alpha^3$$
$$1=\beta^7+\beta^5+\beta^3+\beta$$

So the minimal polynomial of $\alpha^3$ is $$x^7+x+x^3+x+1$$

Step 3: $h_1(x)$ will be the product (minimal polynomial of $\alpha$).(minimal polynomial of $\alpha^3$), and $h_2(x)$ will be its reverse, e.g.

$h_1(x)=(x^7+x+1).(x^7+x^5+x^3+x+1)$ $h_1(x)=x^{14}+x^{12}+x^{10}+x^6+x^5+x^4+x^3+x^2+1$

Step 4: In this case the degree of both minimal polynomials is 7, so the degree of $h_1(x)$ and $h_2(x)$ is 14; accordingly the degree of the product of $h_1(x)$ or $h_2(x)$ and (x–1) is 15, whereas a degree b of 16 is required. Therefore $f_1(x)$ and $f_2(x)$ are used to compensate for this mis-match of degree, by setting $f_1(x)=f_2(x)=(x+1)$.

Step 5: Using the general construction,
$g_3(x)=(x-1).f(x).h_1(x)$ $g_3(x)=x^{16}+x^{10}+x^8+x^7+x^3+1$ as given earlier with reference to FIG. 1. $g_4(x)$ is the reverse of $g_3(x)$, i.e.

$g_4(x)=x^{16}+x^{13}+x^9+x^8+x^6+1$

In some cases manipulation of the powers of the root $\alpha$, as shown in Step 2 of the above examples, may not enable the required minimal polynomial of a power of $\alpha$ (e.g. $\beta=\alpha^3$) to be derived. In such cases it is possible to obtain the required polynomial using computer algebra techniques involving commercially-available software, by computing the polynomial $$\Pi_{0\leq l\leq n-1}(x-\alpha^{ip^j})$$

This will be a power of the required minimal polynomial, which can be obtained by standard factorisation techniques.

Although the above description has related to the case of data transmission over two paths, for the sake of simplicity, the invention is also applicable to transmission over three or more paths (m≧3). In such a case the general procedure for identifying the required generator polynomials is as follows:

Step 1: Find a primitive polynomial of degree n over the Galois Field with p elements GF(p), by reference to Lidl & Niederreiter or by use of known constructive methods;

Step 2: Determine a polynomial $h_1(x)$ such that $h_1(x)=\Pi_{1\leq l\leq b_0}(\text{minimal polynomial of }\alpha^{k(j)})$ where $\alpha$ is a root of the primitive polynomial found in step 1; this polynomial $h_1(x)$ has a degree of at most $b_0.n$, since the degree of the minimal polynomial of any power of $\alpha$ is at most n, and $$\alpha, \alpha^2, \ldots \alpha^{\{k(b_0+1)-1\}}$$

are roots of $h_1(x)$.

Step 3: For $1\leq i\leq \lfloor(m+1)/2\rfloor$, determine $h_{2i-1}(x)$ as a polynomial of degree $n.b_0$ whose roots include $$\alpha^{(i-1).b_0+k(b_0+1)}, \alpha^{(i-1).b_0+k(b_0+1)+1}, \ldots \alpha^{i.b_0+k(b_0+1)-1}$$

($\lfloor(m+1)/2\rfloor$ indicates the greatest integer smaller than or equal to (m+1)/2.)

Step 4: For $1\leq j\leq \lfloor m/2\rfloor$, determine $h_{2j}(x)$ as the reverse of $h_{2j-1}(x)$, that is, the polynomial such that the coefficient of $x^i$ in $h_{2j}(x)$ is equal to the coefficient of $$x^{\text{degree of }h_{2j-1}(x)-i}$$

in $h_{2j-1}(x)$.

Step 5: Select two polynomials $f_1(x)$, $f_2(x)$ of degree (b–1–degree of $h_1(x)$) and m–2 polynomials $f_3(x)$, $f_4(x)$, ... $f_m(x)$, such that each polynomial $f_i(x)$ has degree (b-degree of $h_1(x)$). A general rule of thumb for choosing the polynomials $f_i(x), \ldots, f_m(x)$ is that as many as possible should be irreducible and not be multiples of each other or of (x−1) or of x.

Step 6: Derive $g_1(x)=(x-1).f_1(x).h_1(x)$ and $g_2(x)=(x-1).f_2(x).h_2(x)$. Finally, for $3 \leq i \leq m$, derive $g_i(x)=f_i(x).h_i(x)$.

In the case where y=1, $g_1(x)$ to $g_m(x)$ are themselves the required CRC generator polynomials; if y is greater than one, the CRC generator polynomials have the same coefficients as $g_1(x)$ to $g_m(x)$, but arithmetic must be done modulo $p^y$ instead of modulo p.

The least common multiple of these polynomials $g_1(x), g_2(x), \ldots, g_m(x)$ generates a sub-code of a BCH code over GF(p) with designed distance $2k(b_0+1)+(m-2)b_0$. In this instance the generator polynomial of the BCH code is equal to $(x-1)h_1(x)h_2(x) \ldots h_m(x)$. The polynomials $g_1(x), g_2(x), \ldots, g_m(x)$ each include a respective factor $(x-1).h_1(x), (x-1).h_2(x), h_3(x), \ldots, h_m(x)$ of degree at least b−n+1; the collection of polynomials over GF(p) which are each exactly divisible by all of these factors constitutes a BCH code. Inclusion of the factors $f_1(x), f_2(x), f_3(x), \ldots, f_m(x)$ selects a particular sub-code within this BCH code.

By the property of the BCH bound, the code thus generated detects any error pattern in a packet of length$\leq (p^n-1)$ consisting of $2k(b_0+1)-1+(m-2)b_0$ or fewer errors. It follows that if there is any error pattern which gives errors in $2k(b_0+1)-1+(m-2)b_0$ or fewer identical places on each one of the m channels, and no other errors, then this error pattern will be detected by the system because the checksum on at least one of the channels will report an error.

Each of the polynomials $g_1, g_2$ generates a sub-code of a BCH code over GF(p) with a designed distance $k(b_0+1)+1$ (this is greater than $b_0+1$), so if there is any error pattern giving errors in $k(b_0+1)$ or fewer places on one of the first two channels it will be detected, irrespective of any change in the pattern of symbols on the other channels.

If, for all $1 \leq i \leq \lfloor (m-2)/2 \rfloor$, at least one of $(i-1).b_0+k(b_0+1), (i-1).b_0+k(b_0+1)+1, \ldots, i.b_0+k(b_0+1)-1$ is coprime to $p^n-1$, then each of the polynomials $g_3(x), g_4(x), \ldots, g_m(x)$ generates a sub-code of a BCH code of length $p^n-1$ over GF(p) with designed distance $b_0+1$. It follows that an error will be detected unless it changes more than $b_0$ places on every one of the channels 1, 2, ..., m. (For most values of $p^n$, b, and m likely to be used in practice, the coprimality condition specified above will be satisfied.)

All the polynomials $g_1(x), g_2(x), \ldots g_m(x)$ have degree b. If there is an error pattern which is confined to fewer than b consecutive symbols on one of the channels it will be detected (irrespective of any change in the pattern of symbols on the other channels).

Various modifications may be made to invention as described above. Thus, for example, the de-multiplexer 14 is described above as directing successive 8-symbol bytes for transmission along each of the paths 16 and 18. However, the basic unit for such switching need not be a byte. Instead data could be switched after every symbol, or every four symbols, or any other convenient size portion of a data packet.

What is claimed is:

1. A system for transmitting packets of data along a plurality of paths, said data being transmitted along each path in sub-packets containing at most $p^n-1$ symbols, where p is a prime number, n is a positive integer and the number of different possible symbols is an integer power of p, wherein data transfer on each path is checked for occurrence of errors using cyclic redundancy checks, the cyclic redundancy check for each path being implemented using a respective and different cyclic redundancy check polynomial of degree greater than n, and these different cyclic redundancy check polynomials are chosen to have the property that, when all arithmetic is carried out modulo p, each said polynomial has a respective factor of degree at least b−n+1 such that the collection of polynomials which are each exactly divisible by all such factors constitutes a BCH code.

2. A system according to claim 1, wherein p=2.

3. A system according to claim 1, wherein b is an integer power of two.

4. A system according to claim 1, wherein data are transmitted along two paths.

5. A transmitter for transmitting packets of data along a plurality of paths, said data being transmitted along each path in sub-packets containing at most $p^n-1$ symbols, where p is a prime number, n is a positive integer and the number of different possible symbols is an integer power of p, comprising:

a circuit for routing respective sub-packets along respective said paths;

a first cyclic redundancy check generator in a first of said paths, using a first predetermined cyclic redundancy check polynomial of degree b greater than n; and a second cyclic redundancy check generator in a second of said paths, using a second predetermined cyclic redundancy check polynomial of degree b and which is different from said first cyclic redundancy check polynomial;

said first and second cyclic redundancy check polynomials being chosen to have the property that, when all arithmetic is carried out modulo p, each said polynomial has a respective factor of degree at least b−n+1 such that the collection of polynomials which are each exactly divisible by all such factors constitutes a BCH code.

6. A transmitter according to claim 5, wherein p=2.

7. A transmitter according to claim 5, wherein b is an integer power of two.

8. A transmitter according to claim 5, wherein data are transmitted along two paths.

9. A receiver for receiving data sub-packets transmitted along a plurality of paths, each sub-packet containing at most $p^n-1$ symbols, where p is a prime number, n is a positive integer and the number of different possible symbols is an integer power of p, comprising:

a first cyclic redundancy check comparator in a first of said paths, using a first predetermined cyclic redundancy check polynomial of degree b greater than n; and a second cyclic redundancy check comparator in a second of said paths, using a second predetermined cyclic redundancy check polynomial of degree b and which is different from said first cyclic redundancy check polynomial;

said first and second cyclic redundancy check polynomials being chosen to have the property that, when all arithmetic is carried out modulo p, each said polynomial has a respective factor of degree at least b−n+1 such that the collection of polynomials which are each exactly divisible by all such factors constitutes a BCH code.

10. A receiver according to claim 9, wherein p=2.

11. A receiver according to claim 9, wherein b is an integer power of two.

12. A receiver according to claim 9, wherein data are transmitted along two paths.

13. A method of transmitting data along each of a plurality of paths in sub-packets containing at most $p^n-1$ symbols, where p is a prime number, n is a positive integer and the number of different possible symbols is an integer power of p, wherein data transfer on each path is checked for occurrence of errors using cyclic redundancy checks, the cyclic redundancy check for each path being implemented using a respective and different cyclic redundancy check polynomial of degree b greater than n, and these different cyclic redundancy check polynomials are chosen to have the property that, when all arithmetic is carried out modulo p, each said polynomial has a respective factor of degree at least b−n+1 such that the collection of polynomials which are each exactly divisible by all such factors constitutes a BCH code.

14. A method according to claim 13, wherein p=2.

15. A method according to claim 13, wherein b is an integer power of two.

16. A method according to claim 13, wherein data are transmitted along two paths.

17. A method of transmitting data along each of a plurality of paths in sub-packets containing at most $p^n-1$ symbols, where p is a prime number, n is a positive integer and the number of different possible symbols is an integer power of p, comprising the steps of:

assembling data into sub-packets for each path;

applying a cyclic redundancy check code to data sub-packets for each path, using a respective and different cyclic redundancy check polynomial of degree b greater than n for each path;

transferring the data sub-packets along the respective paths;

receiving the transferred data sub-packets; and checking the data sub-packets transferred along each path for occurrence of errors, using the cyclic redundancy check code applied to each sub-packet and the respective cyclic redundancy check polynomial for each path;

said different cyclic redundancy check polynomials being chosen to have the property that, when all arithmetic is carried out modulo p, each said polynomial has a respective factor of degree at least b−n+1 such that the collection of polynomials which are each exactly divisible by all such factors constitutes a BCH code.

18. A method according to claim 17, wherein p=2.

19. A method according to claim 17, wherein b is an integer power of two.

20. A method according to claim 17, wherein data are transmitted along two paths.

* * * * *

UNITED STATES PATENT AND TRADEMARK OFFICE
CERTIFICATE OF CORRECTION

PATENT NO.   : 6,119,263
DATED        : September 12, 2000
INVENTOR(S)  : Miranda Jane Felicity Mowbray et al.

It is certified that error appears in the above-identified patent and that said Letters Patent is hereby corrected as shown below:

Column 10,
Line 1, change "degree greater than n" to -- degree b greater than n --

Signed and Sealed this

Eighteenth Day of March, 2003

JAMES E. ROGAN
*Director of the United States Patent and Trademark Office*